(12) United States Patent
Wang et al.

(10) Patent No.: US 11,196,440 B1
(45) Date of Patent: Dec. 7, 2021

(54) DIGITAL TO ANALOG CONVERTER FOR FIBER OPTIC GYROSCOPE

(71) Applicant: NATIONAL SUN YAT-SEN UNIVERSITY, Kaohsiung (TW)

(72) Inventors: Chua-Chin Wang, Kaohsiung (TW);
Hsin-Cheng Liu, Kaohsiung (TW);
Yi-Jen Chiu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 17/084,863

(22) Filed: Oct. 30, 2020

(30) Foreign Application Priority Data

Oct. 16, 2020 (TW) .................................. 109135935

(51) Int. Cl.
| | |
|---|---|
| *H03M 1/66* | (2006.01) |
| *H03M 1/06* | (2006.01) |
| *G01C 19/72* | (2006.01) |
| *G01C 19/66* | (2006.01) |

(52) U.S. Cl.
CPC ............ *H03M 1/66* (2013.01); *H03M 1/0665* (2013.01); *H03M 1/0673* (2013.01); *G01C 19/662* (2013.01); *G01C 19/723* (2013.01)

(58) Field of Classification Search
CPC ...... H03M 1/66; G01C 19/723; G01C 19/662
USPC .................................................. 341/144–145
See application file for complete search history.

(56) References Cited

U.S. PATENT DOCUMENTS

| | | | | |
|---|---|---|---|---|
| 6,473,182 B1* | 10/2002 | Tazartes | ............... | H03G 3/3084 250/214 AG |
| 6,703,956 B1* | 3/2004 | Mueller | ................ | H03M 1/682 341/136 |
| 8,711,021 B2* | 4/2014 | Lin | ..................... | H03M 1/0673 341/144 |
| 8,872,687 B1* | 10/2014 | Lin | ..................... | H03M 1/0863 341/144 |
| 9,030,239 B1 | 5/2015 | Dastgheib et al. | | |
| 9,344,104 B1* | 5/2016 | Schafferer | ................ | H03F 3/24 |
| 9,372,168 B2 | 6/2016 | Dastgheib et al. | | |
| 10,955,629 B2 | 3/2021 | Scarlett | | |

FOREIGN PATENT DOCUMENTS

| | | |
|---|---|---|
| TW | 376987 U | 12/1999 |
| WO | 2015102871 A1 | 7/2015 |

\* cited by examiner

*Primary Examiner* — Khai M Nguyen
(74) *Attorney, Agent, or Firm* — WPAT, PC

(57) ABSTRACT

A digital to analog converter for fiber optic gyroscope is disclosed. The digital to analog converter for fiber optic gyroscope includes a random unit generating a random number signal, a plurality of encoding units coupled with the random unit, a plurality of control units respectively one to one coupled with the plurality of encoding units, a current source array coupled with the plurality of control units, and an output load electrically connected to the current source array. Each of the plurality of encoding units converts a plurality of digital signals to a plurality of spin signals according to the random number signal. Each of the plurality of control units converts the plurality of spin signals to a plurality of logic signals. The current source array generates a total current according to the plurality of logic signals. The total current passes through the output load and forms an analog signal.

7 Claims, 2 Drawing Sheets

DIGITAL TO ANALOG CONVERTER FOR FIBER OPTIC GYROSCOPE

The application claims the benefit of Taiwan application serial No. 109135935, filed on Oct. 16, 2020, and the entire contents of which are incorporated herein by reference.

BACKGROUND OF THE INVENTION

1. Field of the Invention

The present invention relates to a signal conversion device and, more particularly, to a digital to analog converter for fiber optic gyroscope to improve the linearity and accuracy of conversion results.

2. Description of the Related Art

Fiber optic gyroscope (FOG) is used for rotation sensing through the principle of optical fiber transmission and the interference characteristics of light. Compared with traditional mechanical gyroscope, which is based on inertial motion and angular momentum conservation to maintain and sense direction, fiber optic gyroscope does not require moving components and is not affected by acceleration and impact, which can improve the accuracy and reliability of rotation sensing. Moreover, the optical waveguide elements and signal processing unit of the fiber optic gyroscope can be integrated into a single chip, which has the effect of saving cost and reducing energy consumption, and can be widely used in navigation and positioning systems in the fields of national defense, aviation, and unmanned vehicles through miniaturization.

The sensing result of the above-mentioned conventional fiber optic gyroscope is obtained by the photo detector receiving the luminous intensity signal, and then converting such discrete-time digital signal to a recognizable continuous analog signal through a signal processing unit. With the continuous miniaturization of element sizes of integrated circuits, the process variation phenomenon is prone to occur during the manufacturing process, which leads to mismatch of the conversion results of the digital to analog circuits and cause errors. Therefore, the conventional digital to analog converter cannot be used in conjunction with high precision fiber optic gyroscope.

In light of this, it is necessary to improve the digital to analog converter for fiber optic gyroscopes.

SUMMARY OF THE INVENTION

To solve the above disadvantages, it is an objective of the present invention to provide a digital to analog converter for fiber optic gyroscope, which can improve dynamic performance and anti-noise ability.

It is another objective of the present invention to provide a digital to analog converter for fiber optic gyroscopes, which can improve signal processing speed and reduce power consumption.

It is a further objective of the present invention to provide a digital to analog converter for fiber optic gyroscopes, which can reduce conversion errors caused by process variation.

As used herein, the term "a" or "an" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

The digital to analog converter for fiber optic gyroscope according to the present invention includes a random unit generating a random number signal, a plurality of encoding units coupled with the random unit, a plurality of control units respectively one to one coupled with the plurality of encoding units, a current source array formed by a plurality of sub-arrays. Each of the sub-arrays coupled with a respective one of the plurality of control units, and an output load electrically connected to the current source array. Each of the plurality of encoding units receives the random number signal and a plurality of digital signals. Each of the plurality of encoding units converts the plurality of digital signals to a plurality of spin signals according to the random number signal. Each of the plurality of control units receives the plurality of spin signals, and converts the plurality of spin signals to a plurality of logic signals through a clock signal. Each of the plurality of sub-arrays forms an independent circuit branch with a respective one of the plurality of encoding units. The independent circuit branches are connected in parallel. Each of the independent circuit branches generates a sub-current according to a respective one of the plurality of logic signals. The current source array generates a total current by summing up the sub-currents. The total current passes through the output load and forms an analog voltage signal at both ends of the output load.

Accordingly, the digital to analog converter for fiber optic gyroscope according to the present invention generates a pseudo random sequence that approximates a true random number with the random unit and each of the plurality of encoding units. When converting digital signals, different current sources can be selected randomly to reduce the problem of current sources mismatch, so as to improve the dynamic performance and linearity of the conversion process, thereby having the effect of improving anti-noise ability and conversion accuracy.

In an example, the random unit is a true random number generator composed of a linear track and hold circuit and a nonlinear discrimination circuit. Thus, the random unit can output an unpredictable sequence, having the effect of reducing the repeatability of the random number signal in a certain period.

In an example, each of the plurality of encoding units receives the random number signal by a selection portion and generates a random sequence for a switching portion, and the switching portion receives the plurality of digital signals. Thus, the encoding unit can convert the plurality of digital signals randomly, having the function of achieving random number effect and improving signal generation efficiency.

In an example, the selection portion is a pseudo random number generator, and the switching portion is a rotator. Thus, the selection portion and the switching portion can rotate the signal rapidly and almost randomly, having the effect of improving conversion efficiency.

In an example, each of the plurality of control units has a plurality of logic gates, the plurality of spin signals is respectively input to the plurality of logic gates, the clock signal controls each of the plurality of logic gates, and the plurality of logic signals is generated through each of the plurality of logic gates. Thus, the control unit can reduce the delay and area of the signal, having the effect of improving the processing speed and reducing the power consumption.

In an example, the current source array has a plurality of drive switches and a plurality of current loops. The plurality of drive switches is coupled with the plurality of control units, the plurality of current loops is respectively one to one electrically connected to the plurality of drive switches, and the plurality of current loops is connected in parallel and all output currents are collected as the total current. Thus, the output currents of each of the plurality of current loops do not interfere with each other, having the effect of reducing the mismatch of the current sources.

In an example, each of the plurality of control units is coupled with the plurality of drive switches, and the plurality of current loops corresponding to the plurality of drive switches forms a sub-array. Thus, the number of sub-arrays can be corresponding to the input bits, which prevents the current source array from overly connected with excessive loops, having the effect of reducing the difficulty of chip layout and circuit heat dissipation.

BRIEF DESCRIPTION OF THE DRAWINGS

The present invention will become clearer in light of the following detailed description of illustrative embodiments of this invention described in connection with the drawings.

DETAILED DESCRIPTION OF THE INVENTION

Figure 1:
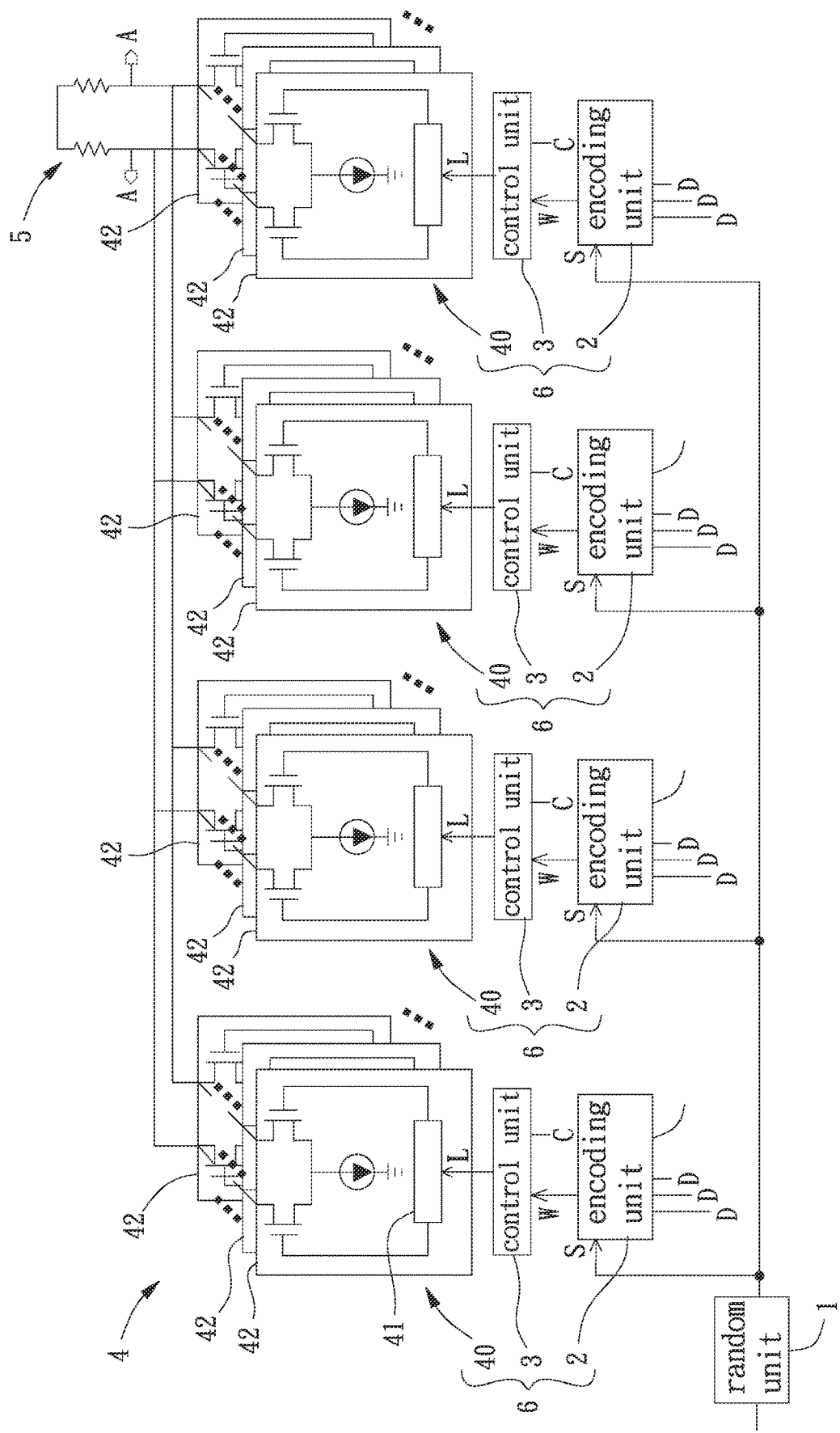
FIG. 1 is a block diagram showing the circuit configuration of a preferred embodiment of the present invention.

Please refer to FIG. 1, which shows a preferred embodiment of the digital to analog converter for fiber optic gyroscope of the present invention. The digital to analog converter includes a random unit 1, a plurality of encoding units 2, a plurality of control units 3, a current source array 4 and an output load 5. The random unit 1 is coupled with each of the plurality of encoding units 2. The plurality of encoding units 2 is respectively one-to-one coupled with the plurality of control units 3. The plurality of control units 3 is coupled with the current source array 4. The current source array 4 is electrically connected to the output load 5.

The random unit 1 can be a true random number generator (TRNG), which is a loop composed of a linear track and hold circuit (LTH) and a nonlinear discrimination circuit (ND). In this loop, the random unit 1 is started by two timer signals with opposite but non-overlapping time sequences, and generates a random number signal S.

Figure 2:
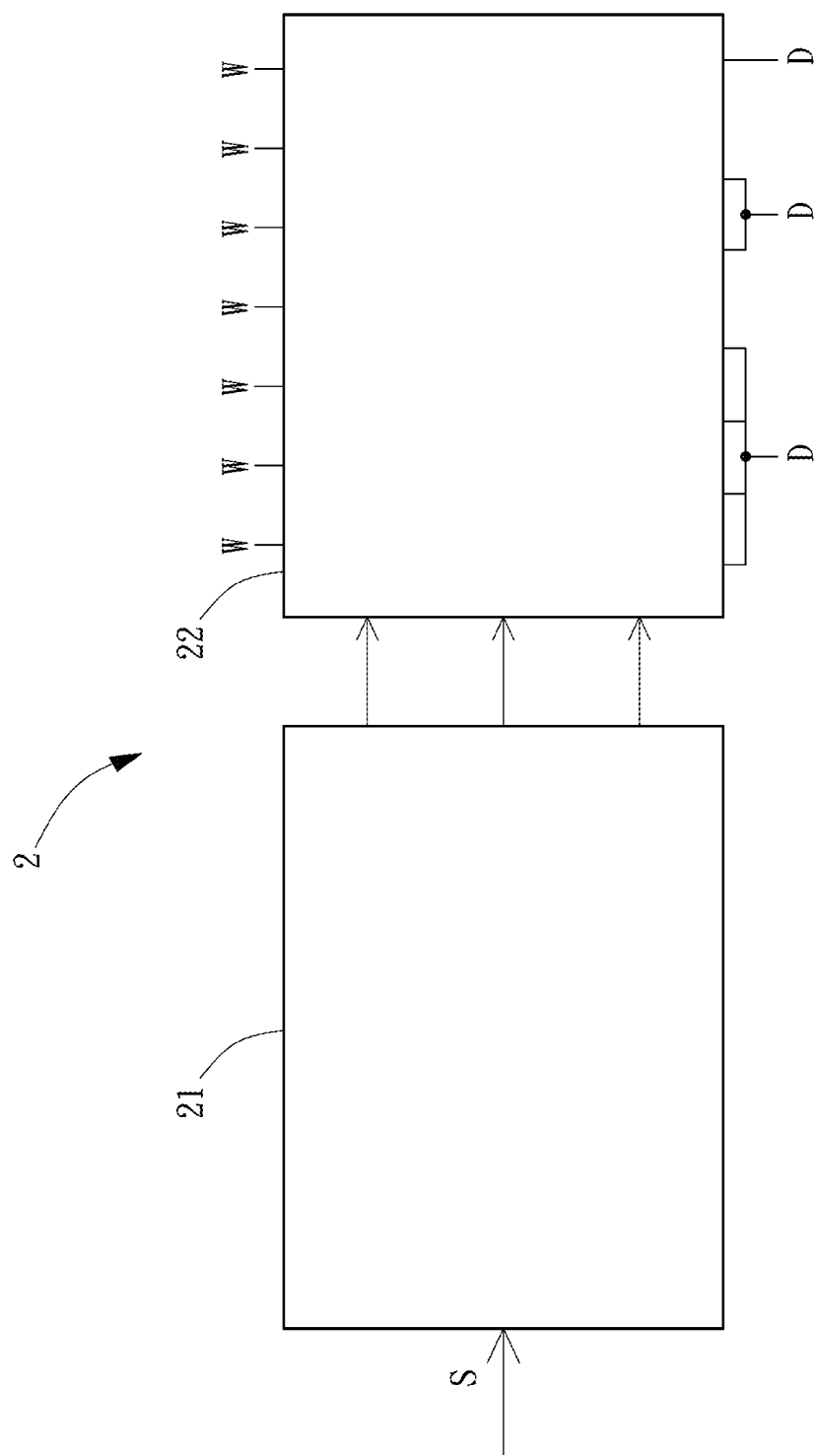
FIG. 2 is a partial enlarged view of the circuit shown in FIG. 1.

Please refer to FIG. 2, each of the plurality of encoding units 2 is a dynamic element matching (DEM) encoder, which receives the random number signal S with a selection portion 21 and generates a random sequence for a switching portion 22. In addition, the switching portion 22 receives a plurality of digital signals D, so that each of the plurality of encoding units 2 converts the plurality of digital signals D to a plurality of spin signals W according to the random number signal S. The selection portion 21 can be a pseudo random number generator (PRNG), which uses the random number signal S as an initial value to generate a pseudo random sequence that approximates a true random number, thereby having the effect of providing random number effect and improving signal generation efficiency. The switching portion 22 can be a rotator, including several multiplexers (MUX), which can rotate each of the plurality of digital signals D randomly according to the pseudo random sequence, and the plurality of digital signals D can be the sensing results of the fiber optic gyroscope. In this embodiment, the digital to analog converter has four encoding units 2, and each of the encoding units 2 can receive three digital signals D at the same time. The digital to analog converter is capable of processing data of twelve-bit data type. However, the present invention is not limited in this regard.

Please refer to FIG. 1, each of the plurality of control units 3 is a dynamic element matching and fully differential current return to zero (RTZ) logic controller, and each of the plurality of control units 3 can received the plurality of spin signals W with a plurality of logic gates respectively. Each of the plurality of control units 3 can control each of the plurality of logic gates with a clock signal C, and convert the plurality of spin signals W to a plurality of logic signals L. Thus, the delay and area of the signals can be deduced, thereby having the effect of improving the processing speed and reducing the power consumption.

The current source array 4 is coupled with the plurality of control units 3 by a plurality of drive switches 41, and the plurality of drive switches 41 is respectively one to one electrically connected to a plurality of current loops 42, so that each of the plurality of drive switches 41 controls the output current of each of the plurality of current loops 42 according to the logic signal L. By connecting the plurality of current loops 42 in parallel, the output currents of each of the plurality of current loops 42 can be kept from interfering with each other, and all the output currents are collected as a total current. In this embodiment, each of the plurality of control units 3 is coupled with a plurality of the drive switches 41 to control the plurality of current loops 42 corresponding to the plurality of the drive switches 41. Thereby, the plurality of current loops 42 corresponding to the plurality of the drive switches 41 can form a sub-array 40. Each sub-array 40 generates a sub-current according to a corresponding logic signal L. The total current is calculated by summing up the sub-current from each of the plurality of sub-arrays 40. Under the above-mentioned configuration, a plurality of independent circuit branches 6 is formed and defined by a control unit 3, a respective one encoding unit 2 and a respective one sub-array 40. The independent circuit branches 6 are connected in parallel. The digital to analog converter has four control units 3 to form four sub-arrays 40; namely, the digital to analog converter has four independent circuit branches 6. However, the present invention is not limited in this regard.

The output load 5 is electrically connected to the current source array 4, so that the total current passes through the output load 5, and forms an analog voltage signal A at both ends of the output load 5.

The digital to analog converter for fiber optic gyroscope of the present invention can be coupled with a photo detector of the fiber optic gyroscope, and can improve the anti-noise ability of the fiber optic gyroscope by providing signal processing of high spur-free dynamic range (SFDR). In the process of digital to analog signal processing, firstly, the photo detector senses an interference phenomenon representing the rotating state and converts the interference phenomenon to the plurality of digital signals D in electronic signal form. The plurality of encoding units 2 respectively receives the plurality of digital signals D and the random number signal S, and uses the random number signal S as a change seed to randomly convert the plurality of digital signals D to a plurality of different spin signals W, which can improve the dynamic parameter and reduce the mismatch in the conversion process.

The plurality of spin signals W determined by random numbers are converted to the plurality of logic signals L through the plurality of control units 3, and the plurality of drive switches 41 select a plurality of different current loops 42 according to the plurality of logic signals L. Thus, when the rotating state of the fiber optic gyroscope is changed to generate the plurality of digital signals D, the plurality of different current loops 42 can be randomly selected to conduct and output currents. Therefore, the analog voltage signal A is generated from the collected total current to improve the dynamic performance of digital to analog conversion and reduce the mismatch.

In summary, the digital to analog converter for fiber optic gyroscope of the present invention generates a pseudo random sequence that approximates a true random number by the random unit and each of the plurality of encoding units. When converting digital signals, different current sources can be selected randomly to reduce the problem of current sources mismatch, so as to improve the dynamic performance and linearity of the conversion process, thereby having the effect of improving anti-noise ability and conversion accuracy.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A digital to analog converter for fiber optic gyroscope, comprising:
   a random unit generating a random number signal;
   a plurality of encoding units coupled with the random unit, wherein each of the plurality of encoding units receives the random number signal and a plurality of digital signals, and each of the plurality of encoding units converts the plurality of digital signals to a plurality of spin signals according to the random number signal;
   a plurality of control units respectively one to one coupled with the plurality of encoding units, wherein each of the plurality of control units receives the plurality of spin signals, and converts the plurality of spin signals to a plurality of logic signals through a clock signal;
   a current source array for generating a total current and formed by a plurality of sub-arrays, wherein each of the sub-arrays coupled with a respective one of the plurality of control units; and
   an output load electrically connected to the current source array, wherein the total current passes through the output load and forms an analog voltage signal at both ends of the output load;
   wherein each of the plurality of sub-arrays, a respective one of the plurality of encoding units, and a respective one of the plurality of control units forms an independent circuit branch; and
   wherein the independent circuit branches are connected in parallel, each of the independent circuit branches generates a sub-current according to a respective one of the plurality of logic signals, and the total current is a sum of the sub-currents.

2. The digital to analog converter for fiber optic gyroscope as claimed in claim 1, wherein the random unit is a true random number generator composed of a linear track and hold circuit and a nonlinear discrimination circuit.

3. The digital to analog converter for fiber optic gyroscope as claimed in claim 1, wherein each of the plurality of encoding units receives the random number signal by a selection portion and generates a random sequence for a switching portion, and the switching portion receives the plurality of digital signals.

4. The digital to analog converter for fiber optic gyroscope as claimed in claim 3, wherein the selection portion is a pseudo random number generator and the switching portion is a rotator.

5. The digital to analog converter for fiber optic gyroscope as claimed in claim 1, wherein each of the plurality of control units has a plurality of logic gates, the plurality of spin signals is respectively input to the plurality of logic gates, the clock signal controls each of the plurality of logic gates, and the plurality of logic signals is generated through each of the plurality of logic gates.

6. The digital to analog converter for fiber optic gyroscope as claimed in claim 1, wherein the current source array has a plurality of drive switches and a plurality of current loops, and wherein the plurality of drive switches is coupled with the plurality of control units, the plurality of current loops is respectively one to one electrically connected to the plurality of drive switches, and the plurality of current loops is connected in parallel and all output currents are collected as the total current.

7. The digital to analog converter for fiber optic gyroscope as claimed in claim 6, wherein each of the plurality of control units is coupled with the plurality of drive switches, and each of the sub-arrays is formed by the plurality of current loops corresponding to the plurality of drive switches.

* * * * *